United States Patent [19]
Komatsu et al.

[11] Patent Number: 6,034,630
[45] Date of Patent: Mar. 7, 2000

[54] ANALOG TO DIGITAL CONVERTER

[75] Inventors: Yoshihiro Komatsu; Kazuhisa Nojima, both of Kanagawa, Japan

[73] Assignee: Sony Corporation, Japan

[21] Appl. No.: 08/985,273

[22] Filed: Dec. 4, 1997

[30] Foreign Application Priority Data

Dec. 13, 1996 [JP] Japan ................................. 8-334189

[51] Int. Cl.[7] ................................................. H03M 1/36
[52] U.S. Cl. ........................ 341/159; 341/158; 341/160
[58] Field of Search .............................. 341/158, 159, 341/160

[56] References Cited

U.S. PATENT DOCUMENTS

| | | | |
|---|---|---|---|
| 4,586,025 | 4/1986 | Knierim ............................... | 341/160 |
| 5,140,326 | 8/1992 | Bacrania et al. ....................... | 341/159 |
| 5,420,587 | 5/1995 | Michel ................................. | 341/156 |
| 5,459,466 | 10/1995 | Knierim et al. ....................... | 341/160 |

*Primary Examiner*—Michael Tokar
*Assistant Examiner*—Anh Q Tran
*Attorney, Agent, or Firm*—Rader, Fishman & Grauer; Ronald P. Kananen

[57] ABSTRACT

An analog to digital converter, which, by comparing utput signals of a first comparator group with a reference voltage by a second comparator group and setting this reference voltage to a level lower than an intermediate level of output signals of the first comparator group, generation of the intermediate level signal in the output signals of the second comparator group is prevented, therefore a malfunction of the analog to digital converter can be avoided.

7 Claims, 14 Drawing Sheets

RELATED ART

FIG. 4A CLK 
FIG. 4B $V_{in}$ $V_{ref}$ 
FIG. 4C $V_{out}$ $V_{/out}$ 
FIG. 5A CLK 
FIG. 5B $V_{in}$ $V_{ref}$ 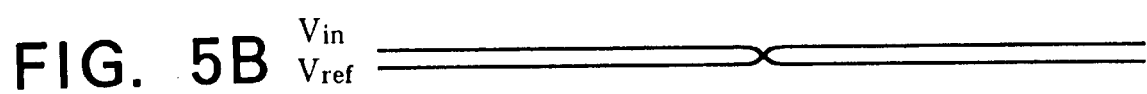
FIG. 5C $V_{out}$ $V_{/out}$ 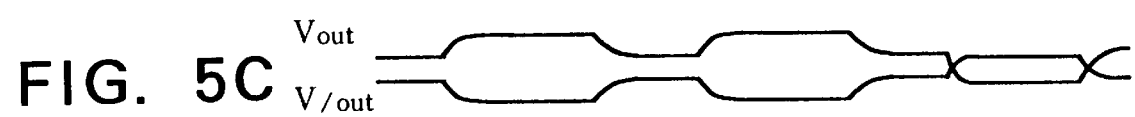

FIG. 13

| DICIMAL DIGIT | BINARY CODE | GRAY CODE |
|---|---|---|
| 15 | 1111 | 1000 |
| 14 | 1110 | 1001 |
| 13 | 1101 | 1011 |
| 12 | 1100 | 1010 |
| 11 | 1011 | 1110 |
| 10 | 1010 | 1111 |
| 9 | 1001 | 1101 |
| 8 | 1000 | 1100 |
| 7 | 0111 | 0100 |
| 6 | 0110 | 0101 |
| 5 | 0101 | 0111 |
| 4 | 0100 | 0110 |
| 3 | 0011 | 0010 |
| 2 | 0010 | 0011 |
| 1 | 0001 | 0001 |
| 0 | 0000 | 0000 |

ANALOG TO DIGITAL CONVERTER

BACKGROUND OF THE INVENTION

1. Field of the Invention

The present invention relates to an analog to digital converter, and, more particularly relates to a flash type analog to digital converter.

2. Description of the Related Art

A flash type analog to digital converter compares analog voltages input to a plurality of comparators and reference voltages obtained from voltage division resistors and converts output signals from these comparators to a digital code by an encoder. FIG. 1 is a view showing an example of the flash type analog to digital converter for converting an analog signal $V_{in}$ to four bits D3, D2, D1, and D0 of digital signals. As illustrated, 16 resistor elements R16, R15, ..., and R1 are connected in series between reference voltages $V_{ref1}$ and $V_{ref0}$. Contacts of these resistor elements are connected to inverted input terminals (−) of 15 comparators C15, C14, ..., and C1, and the analog signal $V_{in}$ is connected to the non-inverted input terminals (+) of the comparators C15, C14, ..., and C1. Output signals of the comparators C15, C14, ..., and C1 or the inverted signals thereof are individually input to 15 AND gates A15, A14, ..., and A1. For example, the output signal of the comparator C15 is input to both input terminals of the AND gate A15, while the inverted signal thereof is input to one input terminal of the AND gate A14 and the output signal of the comparator C14 is input to the other input terminal of the AND gate A14.

Output signals of the AND gates A15, A14, ..., and A1 are input to the encoder ECD. The encoder ECD converts 15 signals input from the AND gates A15, A14, ..., and A1 to four bits D3, D2, D1, and D0 of digital signals.

Note that the encoder ECD is constituted by a ROM circuit formed on for example a substrate. The ECD part of FIG. 1 is a conceptual view of an operational principle thereof. A double circle in the figure indicates a logical element for finding the OR logic of the signals. For example, as illustrated, the most significant bit (MSB) D3 of the digital signals D3, D2, D1, and D0 is found by the OR logic of the eight output signals of the AND gates A15 to A8. The least significant bit (LSB) D0 is found by the OR logic of the eight output signals of the AND gates A15, A13, A11, A9, A7, A5, A3, and A1.

Namely, the output signals of the AND gates A15 to A1 are converted to binary codes by the illustrated encoder ECD. Further, it is also possible to think of the AND gates A15 to A1 and the encoder ECD together as an encoder. The encoder of this case has a function for converting the 15 output signals of the comparators C15 to C1 to the binary codes.

In the above flash type analog to digital converter, 16 divided reference voltages are generated by the 16 resistor elements R16 to R1 connected in series. These reference voltages are individually input to the inverted input terminals (−) of the comparators C15 to C1. The analog signal $V_{in}$ is input to the non-inverted input terminals (+) of the comparators C15 to C1. The comparators operate in accordance with the (not illustrated) clock signal, compare the analog signal $V_{in}$ and the reference voltage at for example the rising edge of the clock signal, and output signals of the high level or low level to the output terminals.

FIG. 2 is a view showing an example of the conversion operation of the analog to digital converter.

In FIG. 2, "H" indicates a state where the signal line is held at a high level, and "L" indicates a state where the signal line is held at a low level. In this example, it is assumed that for example the input analog signal $V_{in}$ is higher than the reference voltage $V_{r8}$ input to the inverted input terminal of the comparator C8 and lower than the reference voltage input to the inverted input terminal of the comparator C9. In this case, the output signals of the comparators C8 to C1 at a high level "H", and the output signals of the comparators C15 to C9 are at a low level "L". Then, signals other than the output signal of the AND gate A8 are all held at the low level. The output signals D3, D2, D1, and D0 of the encoder ECD become "HLLL". This corresponds to for example "1000" of the binary code.

In this way, by the flash type analog to digital converter, a digital code in accordance with the level of the input analog signal $V_{in}$ is obtained. Namely, the analog signal $V_{in}$ is converted to a digital signal of the binary code format.

In the above flash type analog to digital converter of the related art, there is a problem of the output after the conversion becoming unstable, i.e., the "meta-stable" problem. Namely, when a difference between the analog signal $V_{in}$ and the reference voltage of the comparator is small, even if the output signal of the comparator is in the latched state, the output signal level does not completely become the high level or low level and the comparator outputs an intermediate level "M" (hereinafter, referred to as the "M level"), whereby there is a possibility of occurrence of an error in the output code of the encoder. Below, the cause thereof will be explained referring to the circuit diagram of the comparator shown in FIG. 3 and waveform diagrams shown in FIGS. 4 and 5.

FIG. 3 is a view showing an example of a comparator having a latching function. The comparator of the present example is constituted by resistor elements R1 and R2, current sources I1, I2, and I3, and npn transistors Q1 to Q8.

A differential amplifier is constituted by npn transistors Q1, Q2, and Q3. The base of the npn transistor Q1 is connected to the input terminal $T_{in}$ of the analog signal $V_{in}$, and a collector is connected to the supply line of a power supply voltage $V_{CC}$ via a resistor element R1. The base of the npn transistor Q2 is connected to the input terminal $T_{ref}$ of the reference voltage $V_{ref}$, and the collector is connected to the supply line of the power supply voltage $V_{CC}$ via a resistor element R2. Contacts of the collectors of these npn transistors and the resistor elements form nodes ND1 and ND2. Emitters of the npn transistors Q1 and Q2 are commonly connected to the collector of the npn transistor Q3.

A latch circuit is constituted by npn transistors Q4. Q5, and Q6. The base of the npn transistor Q4 is connected to the node ND2, the collector is connected to a node ND1, the base of the npn transistor Q5 is connected to the node ND1, and the collector is connected to the node ND2. Emitters of these npn transistors are commonly connected to the collector of the npn transistor Q6.

Further, the base of the npn transistor Q3 is connected to the input terminal $T_{clkn}$ of the clock signal CLKN, the base of the npn transistor Q6 is connected to the input terminal $T_{clk}$ of the clock signal CLK, and the emitters of these npn transistors are connected to the current source I1. Here, the clock signal CLKN is the inverted signal of the clock signal CLK.

The output circuit is constituted by npn transistors Q7 and QB and current sources I2 and I3. The base of the npn transistor Q7 is connected to the node ND1, the collector is connected to the supply line of the power supply voltage $V_{CC}$, and the emitter is connected to the current source I2. The base of the npn transistor Q8 is connected to the node ND2, the collector is connected to the supply line of the power supply voltage $V_{CC}$, and the emitter is connected to the current source I3.

Further, the emitter of the npn transistor QB is connected to the output terminal $T_{out}$ of the comparator, and the emitter of the npn transistor Q7 is connected to the inverted output terminal $T_{/out}$ of the comparator.

In a semi-cycle where the clock signal CLKN is at a high level, a current $i_1$ of the current source I1 flows through the collector of the npn transistor Q3, a differential amplifier constituted by the npn transistors Q1 and Q2 operates, and potentials of the collectors of these transistors, that is, the nodes ND1 and ND2, are determined in accordance with the levels of the analog signal $V_{in}$ and the reference voltage $V_{ref}$. For example, when the level of the analog signal $V_{in}$ is higher than the reference voltage $V_{ref}$, the node ND1 is held at the low level and the node ND2 is held at the high level. Further, at this time, the clock signal CLK has become the low level, therefore, a current does not flow through the collector of the npn transistor Q6. and the latch circuit does not operate.

After the clock signal CLKN is switched to the low level, a current does not flow through the collector of the npn transistor Q3, current flows through the collector of the npn transistor Q6, the latch circuit operates, and the potentials of the nodes ND1 and ND2 are held.

In this way, during a period where the clock signal CLKN is at the high level and the clock signal CLK is at the low level, a difference between the analog signal $V_{in}$ and the reference voltage $V_{ref}$ is amplified by the differential amplifier and output to the nodes ND1 and ND2. During a period where the clock signal CLKN is at the low level and the clock signal CLK is at the high level, the potentials of the nodes ND 1 and 2 are held by the latch circuit.

The potentials of the nodes ND1 and ND2 are converted in level by the output circuit comprising the npn transistors Q7 and Q8 and the current sources I2 and I3 and then output.

By the above comparator, where the level of the analog signal $V_{in}$ is higher than the reference voltage $V_{ref}$, the output terminal $T_{out}$ is held at the high level (hereinafter referred to as an "H level"), and the inverted output terminal $T_{/out}$ is held at the low level (hereinafter referred to as an L level). Conversely, where the level of the analog signal $V_{in}$ is lower than the reference voltage $V_{ref}$, the output terminal $T_{out}$ is held at the L level and the inverted output terminal $T_{/out}$ is held at the H level, FIG. 4 is a view showing waveforms of the clock signal CLK, analog signal $V_{in}$, reference voltage $V_{ref}$, and output signals $V_{out}$, and $V_{/out}$ of the comparator.

When the level difference between the analog signal $V_{in}$ and the reference voltage $V_{ref}$ is small, even in the latch mode when the clock signal CLK is at the high level, the output signal is not completely set at the H level or the L level, and the signal of M level is sometimes output to the output terminal $T_{out}$ and the inverted output terminal $T_{/out}$ of the comparator. The waveform diagram of FIG. 5 shows such a state.

The output signal of M level of the comparator is similarly output as the M level to the encoder ECD via the AND gate of the latter stage. Among the output signals D3, D2, D1, and D0 of the encoder ECD, a bit which is output while being held at the M level as it is produced. The M level is finally recognized to be either of the H level or the L level. There arises a possibility of malfunction of the analog to digital converter because of the M level signal.

Here, assume that the level of for example the input analog signal $V_{in}$ is almost the same as the level of the reference voltage $V_{r8}$ input to the inverted input terminal (−) of the comparator C8. At this time, the signal of the M level is output to the output terminal of the comparator C8, and the output signals of both of the AND gates A8 and A7 are set to the M level in accordance with this. Below, an explanation will be made of four modes wherein output signals "MM" of the AND gates A8 and A7 are respectively recognized to be "HH" "HL", "LH", and "LL".

FIGS. 6 to 9 are views showing the states of the output signal of the encoder ECD in the four modes mentioned above.

As shown in FIG. 6, the output signals of the AND gates A8 and A7 are recognized to be "HH". The output of the encoder ECD becomes "HHHH" according to this. This corresponds to the case where the level of the analog signal $V_{in}$ exceeds the level of the reference voltage $V_{r15}$ input to the comparator C15 and therefore an error occurred in the conversion result.

In the case of FIG. 7, the output signals of the AND gates A8 and A7 are recognized to be "HL", the output of the encoder ECD becomes "HLLL" according to this, and this is recognized as the normal conversion result.

In the case of FIG. 8, the output signals of the AND gates A8 and A7 are recognized to be "LH", the output of the encoder ECD becomes "LHHH" according to this, and this is recognized too as the normal conversion result.

On the other hand, as shown in FIG. 9, the output signals of the AND gates A8 and A7 are recognized to be "LL", the output of the encoder ECD becomes "LLLL" according to this. This corresponds to the case where the level of the analog signal $V_{in}$ is not more than the level of the reference voltage $V_{r1}$ input to the comparator C1 and an error occurs in the conversion result.

As mentioned above, when the signal of the "MM" level is output to the AND gates A8 and A7, when the output signals are recognized as "HH" or "LL", the analog to digital converter malfunctions. In order to solve this, in the analog to digital converter of the related art, there is a method of setting the latch mode time large until the output signal level of the comparator is sufficiently defined to either of "H" or "L", thereby eliminating the M level of the output signal and preventing a malfunction, but it has a defect of a reduction of the operation speed of the analog to digital converter.

SUMMARY OF THE INVENTION

An object of the present invention is to provide an analog to digital converter capable of avoiding the malfunctions and performing a high speed operation.

To attain the above object, the present invention provides an analog to digital converter comprising a first comparison circuit including a plurality of comparing means for comparing levels of reference voltages obtained from a plurality of voltage division resistor elements connected in series and the input analog signal, outputting a first level or a second level according to the result of the comparison, and outputting signals of an intermediate level of the first and second levels by the comparing means when a difference between the analog signal and the reference voltage is a predetermined value or less; a second comparison circuit comprising a plurality of comparing means for comparing output signals of the comparing means constituting the first comparison circuit with the reference voltage set to the intermediate level or less and inputting the signal of either of the first and second levels according to the result of the comparison; and an encoder for converting the output signal of the second comparison circuit to digital codes.

Further, the present invention provides an analog to digital converter comprising a first comparison circuit including a plurality of comparing means for comparing levels of reference voltages obtained from a plurality of voltage division resistor elements connected in series and an input analog signal, outputting signals of a first level or a second level according to the result of the comparison, and outputting signals of an intermediate level of the first and second levels by the comparing means when a difference between the analog signal and the reference voltage is a predetermined value or less; an encoder for converting the output signal of the first comparison circuit to digital codes, the encoder having a signal converter for setting only one among a plurality of output signals to the first level according to the input signal from the first comparison circuit, holding other output signals at the second level, and holding at least one output signal at the intermediate level when receiving the signal of the intermediate level from the first comparison circuit; a second comparison circuit for comparing the output signal of the signal converter with a reference voltage set to the intermediate level or less and outputting the signal of either of the first and second levels according to the result of the comparison; and a code converter for converting the output signal of the second comparison circuit to a gray code.

Further, the present invention provides an analog to digital converter comprising a first comparison circuit including a plurality of comparing means for comparing levels of reference voltages obtained from a plurality of voltage division resistor elements connected in series and the input analog signal, outputting signals of a first level or a second level according to the result of the comparison, and outputting signals of an intermediate level of the first and second levels by the comparing means when a difference between the analog signal and the reference voltage is a predetermined value or less; an encoder for converting the output signal of the first comparison circuit to gray codes and outputting the converted codes containing the intermediate level when receiving the signal of the intermediate level from the first comparison circuit; a third comparison circuit which is connected to each output signal line of the encoder, compares the output code of the encoder with the reference voltage set to the intermediate level or less, and outputs the signal of either of the first and second levels according to the result of the comparison.

Further, in the present invention, preferably, the encoder converts the input signal to the gray code and has a converter for converting the gray code output by the encoder to the binary code.

According to the present invention, a second comparison circuit for performing a comparison operation using the intermediate level as the reference voltage is provided, and a signal of the intermediate level received from the first comparison circuit is compulsorily converted to a first level, for example, the high level, by the second comparison circuit. When the second comparison circuit is arranged between the first comparison circuit and the encoder, or when the encoder includes a signal converter and a code converter, the second comparison circuit is arranged between the signal converter and the code converter. Preferably, the code converter comprises a converter for generating a gray code.

By this, a signal of the intermediate level is compulsorily converted to the first level by the second comparison circuit, the error of the output code of the encoder due to the intermediate level signal can be prevented, and a malfunction of the analog to digital converter can be avoided.

Further, a third comparison circuit for performing a comparison operation using the intermediate level as the reference voltage is provided on the output side of the encoder, the intermediate level of the output signal of the encoder is compulsorily converted to the first level, and thus a malfunction of the analog to digital converter due to the intermediate level can be avoided. Also in this case, an encoder which outputs a gray code is desirable. In this case, the number of the comparing means constituting the third comparison circuit is smaller than that of the second comparison circuit, an increase of the layout area of the circuit can be suppressed to the lowest limit, and thus a reduction of the power consumption can be achieved.

By the above mentioned configuration, a malfunction of the analog to digital converter due to the intermediate level signal can be avoided, the operation time in the latch mode of the comparing means equipped with a latch function constituting the first comparison circuit can be shortened, so an improvement of the comparison speed of the analog to digital converter can be achieved.

BRIEF DESCRIPTION OF THE DRAWINGS

These and other objects and features of the present invention will become clearer from the following description of the preferred embodiments given with reference to the attached drawings, wherein:

FIG. 4, consisting of FIG. 4A through FIG. 4C, is a waveform diagram of the operation of the comparator shown in FIG. 3;

FIG. 5, consisting of FIG. 5A through FIG. 5C, is a waveform diagram where the comparator shown in FIG. 3 outputs an intermediate level;

FIG. 13 is a view of a gray code and a binary code;

DESCRIPTION OF THE PREFERRED EMBODIMENTS

Figure 1:
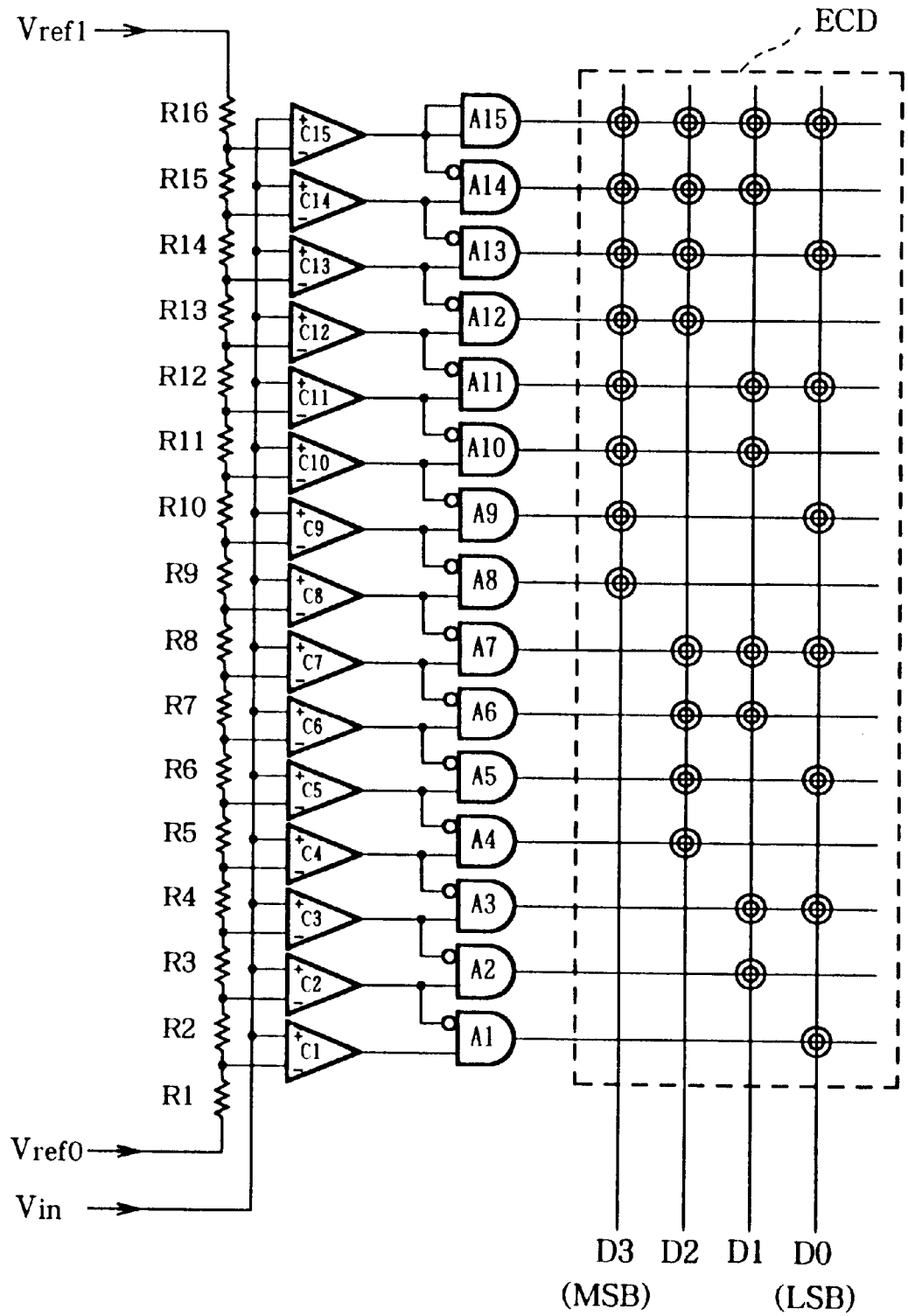
FIG. 1 is a circuit diagram of an analog to digital converter of the related art.

Below, a detailed explanation will be made of embodiments of the present invention by referring to the drawings.

Figure 10:
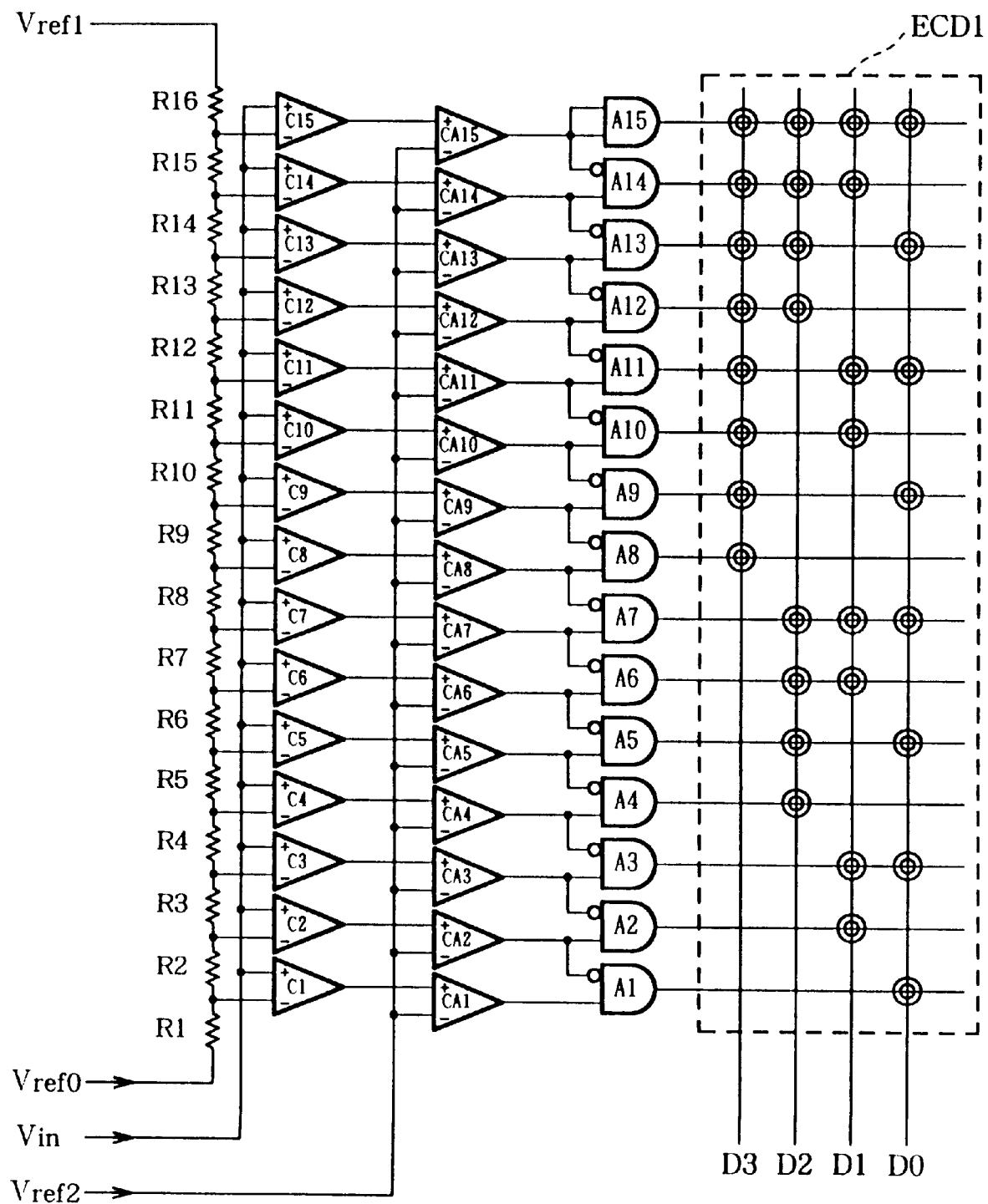
FIG. 10 is a circuit diagram of a first embodiment of the analog to digital converter according to the present invention.

FIG. 10 is a circuit diagram of a first embodiment of the analog to digital converter according to the present invention. When compared with the analog to digital converter of the related art shown in FIG. 1, the present embodiment is different in the point that the comparators CA15 to CA1 are connected between the comparators C15 to C1 and the AND gates A15 to A1, respectively. The other parts are substantially the same as those of the analog to digital converter of the related art and represented by using the same references as those of FIG. 1. Further, ECD1 of FIG. 10 is similar to the encoder ECD shown in FIG. 1. It is an encoder for converting the output signals of the AND gates A15 to A1 to binary codes.

As the comparators CA15 to CA1, ones substantially similar to the comparators C15 to C1 can be used. Note, a common reference voltage $V_{ref2}$ is input to the inverted input terminals of the comparators CA15 to CA1, and the output signals of the comparators CA15 to C1 are input to the non-inverted input terminals.

Figure 2:
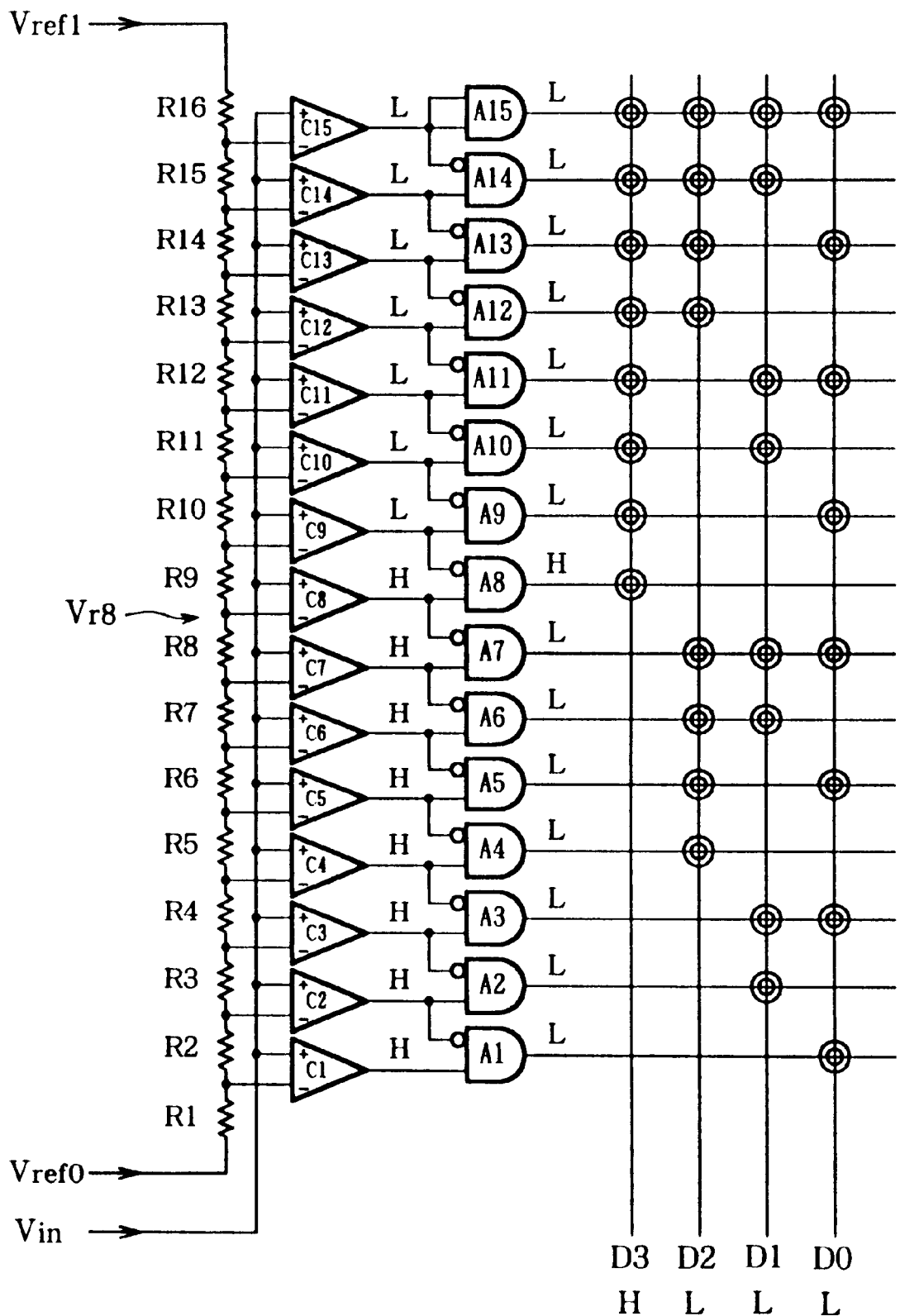
FIG. 2 is a view of an example of a conversion operation of an analog to digital converter of the related art shown in FIG. 1.
Figure 3:
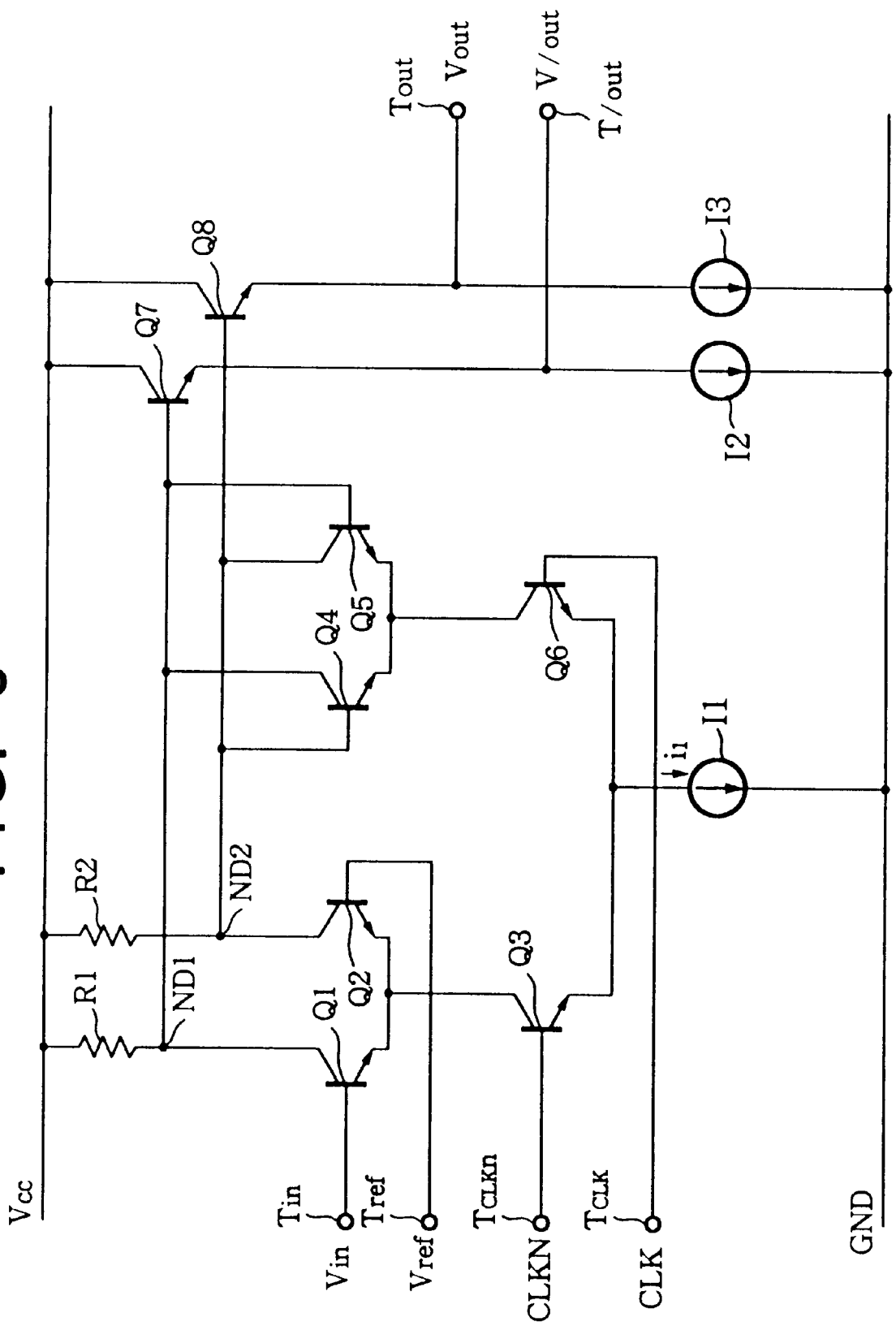
FIG. 3 is a circuit diagram of the configuration of a comparator used in the analog to digital converter shown in FIG. 1.
Figure 6:
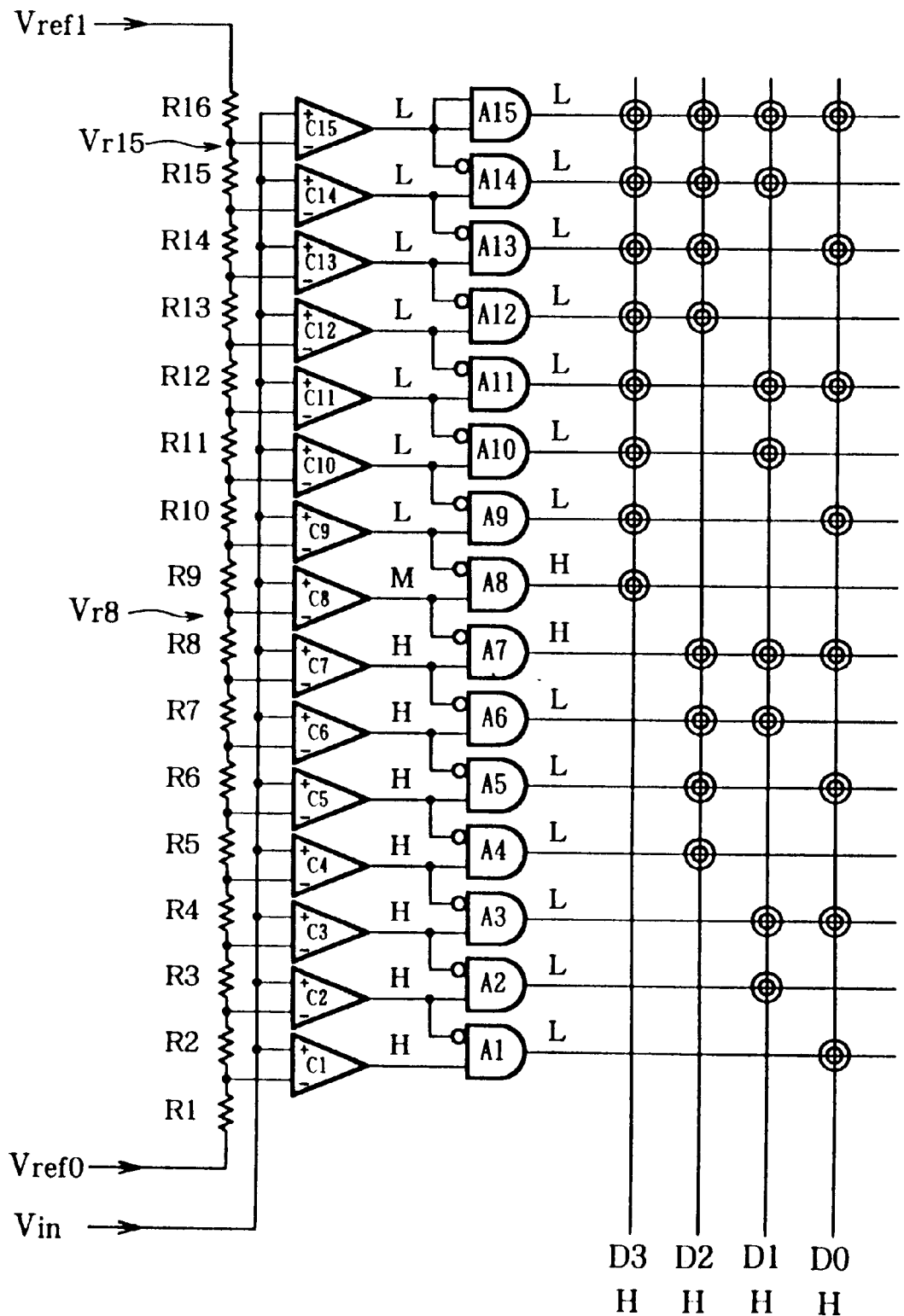
FIG. 6 to FIG. 9 are views of the conversion operation where the comparator outputs a signal of an intermediate level.
Figure 7:
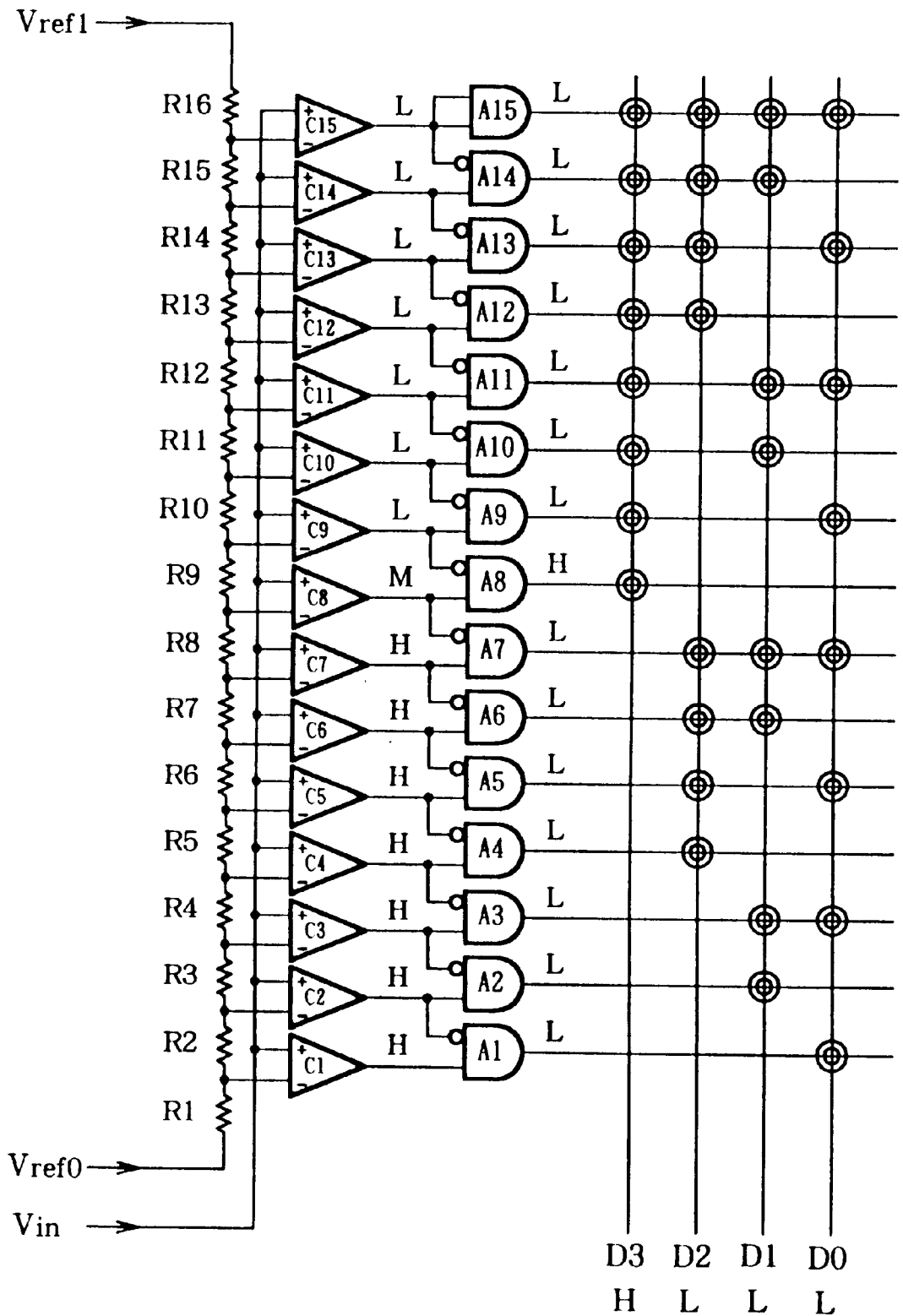
Figure 8:
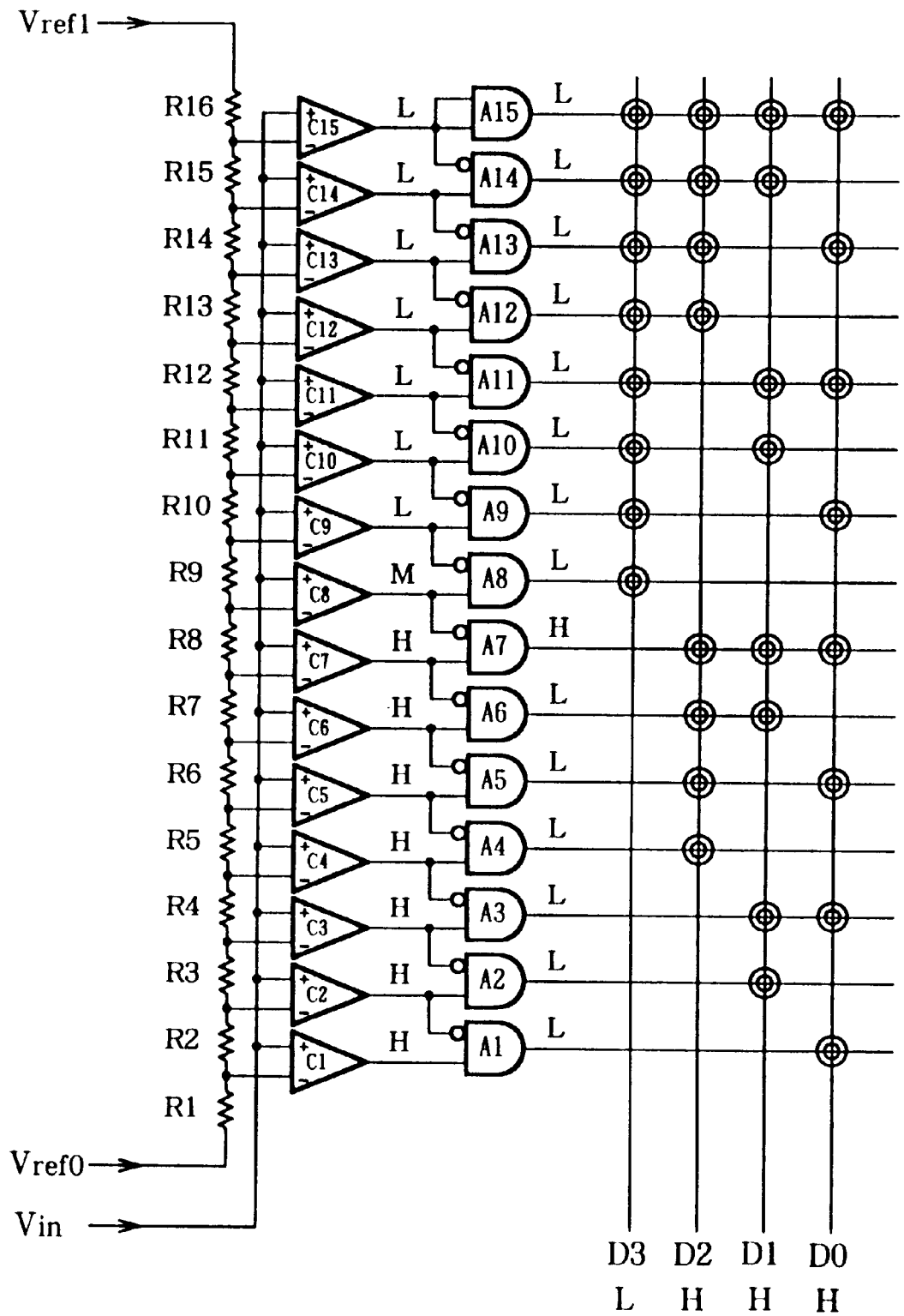
Figure 9:
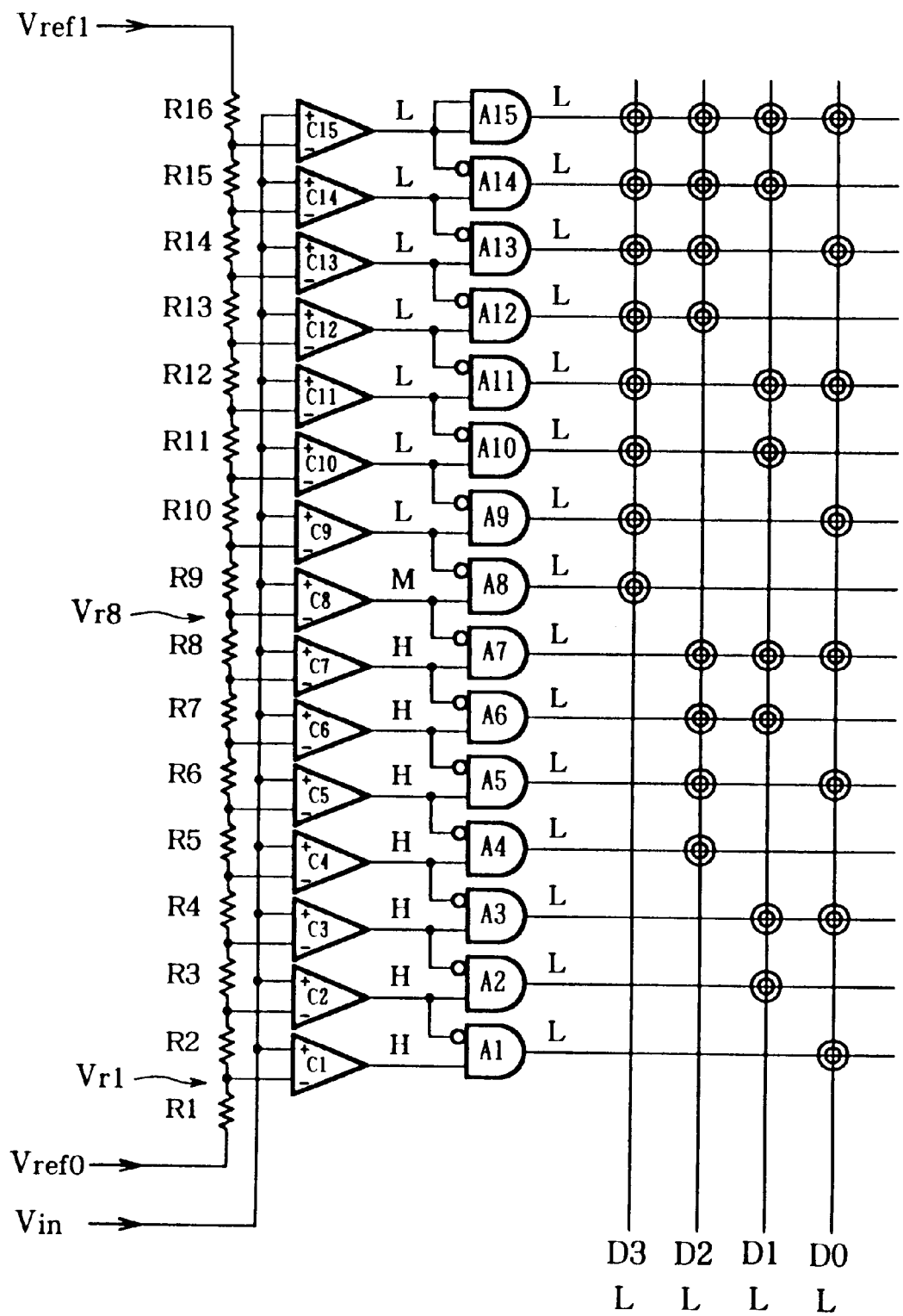
Figure 11:
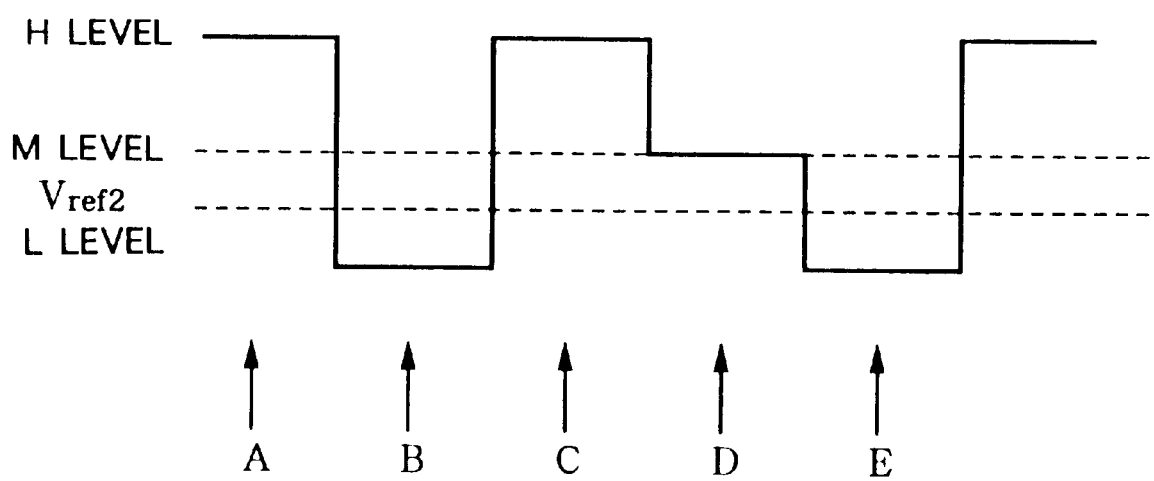
FIG. 11 is a view of the level of a reference voltage $V_{ref2}$ applied to the analog to digital converter shown in FIG. 10.

FIG. 11 is a view showing an example of the output signals of the comparators C15 to C1 and the reference voltage $V_{ref2}$ input to the comparators CA15 to CA1. The output levels of the comparators have become the H, L, H, M, and L levels at the points of time of A, B, C, D, and E, respectively. The level of the reference voltage $V_{ref2}$ is set to a level lower than the M level as illustrated. As a result, by comparing the output signals of the former stage comparators with the reference voltage $V_{ref2}$, the results of the comparison at the points of time A, B, C, D, and E shown in FIG. 2 become H, L, H, H, and L, respectively. In this way, by the result of comparison of the output signal of the M level, which is the cause of the malfunction of the analog to digital converter, with the reference voltage $V_{ref2}$, the M level is compulsorily converted to the H level. By this, the M level is not caused in the output signals of the AND gates A15 to A1 connected to the latter stage of the comparators CA15 to CA1, and a malfunction is avoided.

As explained above, according to the present embodiment, by comparing the output signals of the comparators C15 to C1 with the reference voltage $V_{ref2}$ by the comparators CA15 to CA1 and setting the reference voltage $V_{ref2}$ to a level lower than the M level of the output signals of the comparators C15 to C1, the generation of the M level of output signals of the comparators CA15 to CA1 is prevented, therefore a malfunction of the analog to digital converter can be avoided.

Next, an explanation will be made of a second embodiment of the present invention.

Figure 12:
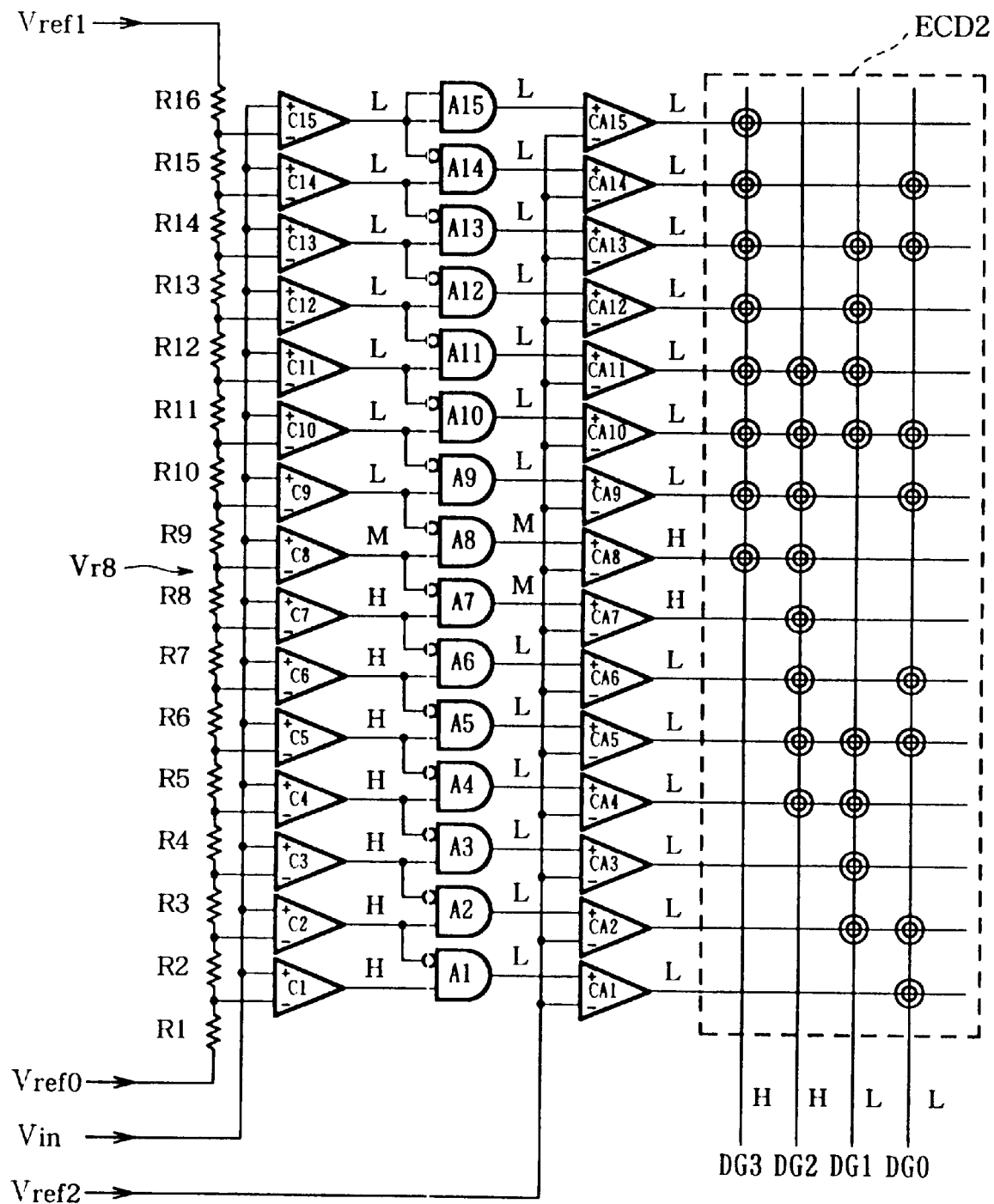
FIG. 12 is a circuit diagram of a second embodiment of the analog to digital converter according to the present invention.

FIG. 12 is a circuit diagram of the second embodiment of the analog to digital converter according to the present invention. In the present embodiment, compared with the analog to digital converter of the related art, comparators CA15 to CA1 are provided. These comparators are connected to the output side of the AND gates A15 to A1. The output signals are input to the encoder ECD2.

The encoder ECD2 is an encoder for converting the input signal to gray codes unlike the encoder ECD1 of the first embodiment shown in FIG. 10. In the present embodiment, the encoder ECD2 outputs four bits DG3, DG2, DG1, and DG0 of gray codes in accordance with the 15 signals to be input.

The configuration of the comparators CA15 to CA1 is similar to that used in the first embodiment. In the present embodiment, the reference voltage $V_{ref2}$ is applied to the inverted input terminals of the comparators CA15 to CA1, and the output signals of the AND gates A15 to A1 are respectively input to the non-inverted input terminals. Note that the reference voltage $V_{ref2}$ is set to a level lower than the H level of the output signals of the AND gates.

In such a configuration, for example, when the level of the input analog signal $V_{in}$ is substantially the same as the level of the reference voltage $V_{r8}$ input to the inverted input terminal of the comparator C8, a signal of the M level is output to the output terminal of the comparator C8. Both of the output signals of the AND gates A8 and A7 are held at the M level according to this. At this time, both of the output signals of the AND gates A8 and A7 are set to the H level. The output signals of the comparators other than them are held at the L level.

In the encoder ECD1 of FIG. 10 for converting the input signal to binary codes, in a state where both of the output signals of the comparators CA8 and CA7 become the H level, the output signal of the encoder ECD1 becomes "HHHH" and the conversion result is erroneous. In order to solve this, in the present embodiment, use is made of the encoder ECD2 for converting the input signal to gray codes.

FIG. 13 is a view showing the gray codes and the binary codes in correspondence. As illustrated, in the gray codes, two adjoining codes differ in only one bit. Namely, the hamming distance is smaller in the gray codes compared with the binary codes.

In the present embodiment, a malfunction of the analog to digital converter is prevented by utilizing this characteristic feature of the gray codes. In the above example, in a state where both of the output signals of the comparators CA8 and CA7 have become the H level, the output signal of the encoder ECD2 becomes "HHLL", and according to FIG. 13, a correct conversion result is obtained corresponding to "HLLL" of the binary codes.

Figure 14:
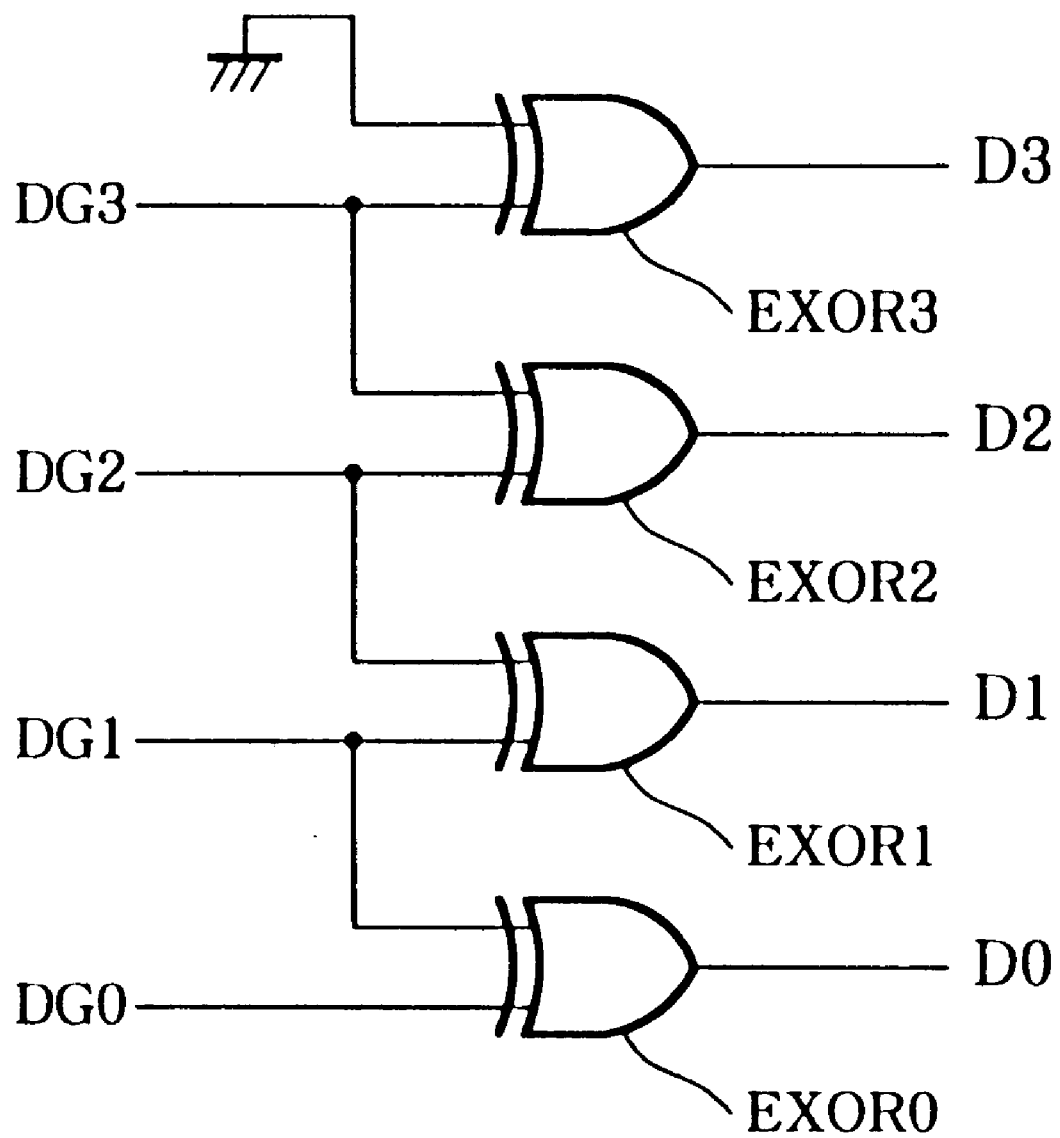
FIG. 14 is a circuit diagram of a gray code to binary code converter.

The gray code can be easily converted to a binary code by a logical circuit comprising exclusive OR gates. FIG. 14 shows an example of the converter for converting four bits DG3, DG2, DG1, and DG0 of gray codes to four bits D3, D2, D1, and D0 of binary codes. This converter comprises four exclusive OR gates EXOR3, EXOR2, EXOR1, and EXOR0. Signals of the predetermined bit of the gray codes and the upper significant bit thereof are input to the input terminal of each exclusive OR gate. Note that, the signal of the most significant bit of the gray codes is input to one input terminal of the exclusive OR gate generating the most significant bit. The other input terminal is held at the low level. For this reason, the most significant bit of the binary codes is the same as the most significant bit of the gray codes, so the exclusive OR gate EXOR3 for converting the most significant bit can be omitted.

By using this circuit, the gray codes DG3, DG2, DG1, and DG0 generated at the encoder ECD2 can be easily converted to the binary codes D3, D2, D1, and D0. Therefore, complication of the circuit configuration can be avoided without making major changes to the converter.

As explained above, according to the present embodiment, by comparing the output signals of the AND gates A15 to A1 with the reference voltage $V_{ref2}$ by the comparators CA15 to CA1 and setting the reference voltage $V_{ref2}$ to the level lower than the M level of the output signals of the AND gates A15 to A1, the M level in the output signals of the AND gates A15 to A1 is compulsorily converted to the H level, the output signals of the comparators CA15 to CA1 are converted to gray codes by the encoder ECD2, and then the gray codes can be converted to the binary codes by a simple logical circuit, therefore the malfunction of the analog to digital converter can be avoided without greatly changing the circuit configuration.

Next, an explanation will be made of a third embodiment of the present invention.

Figure 15:
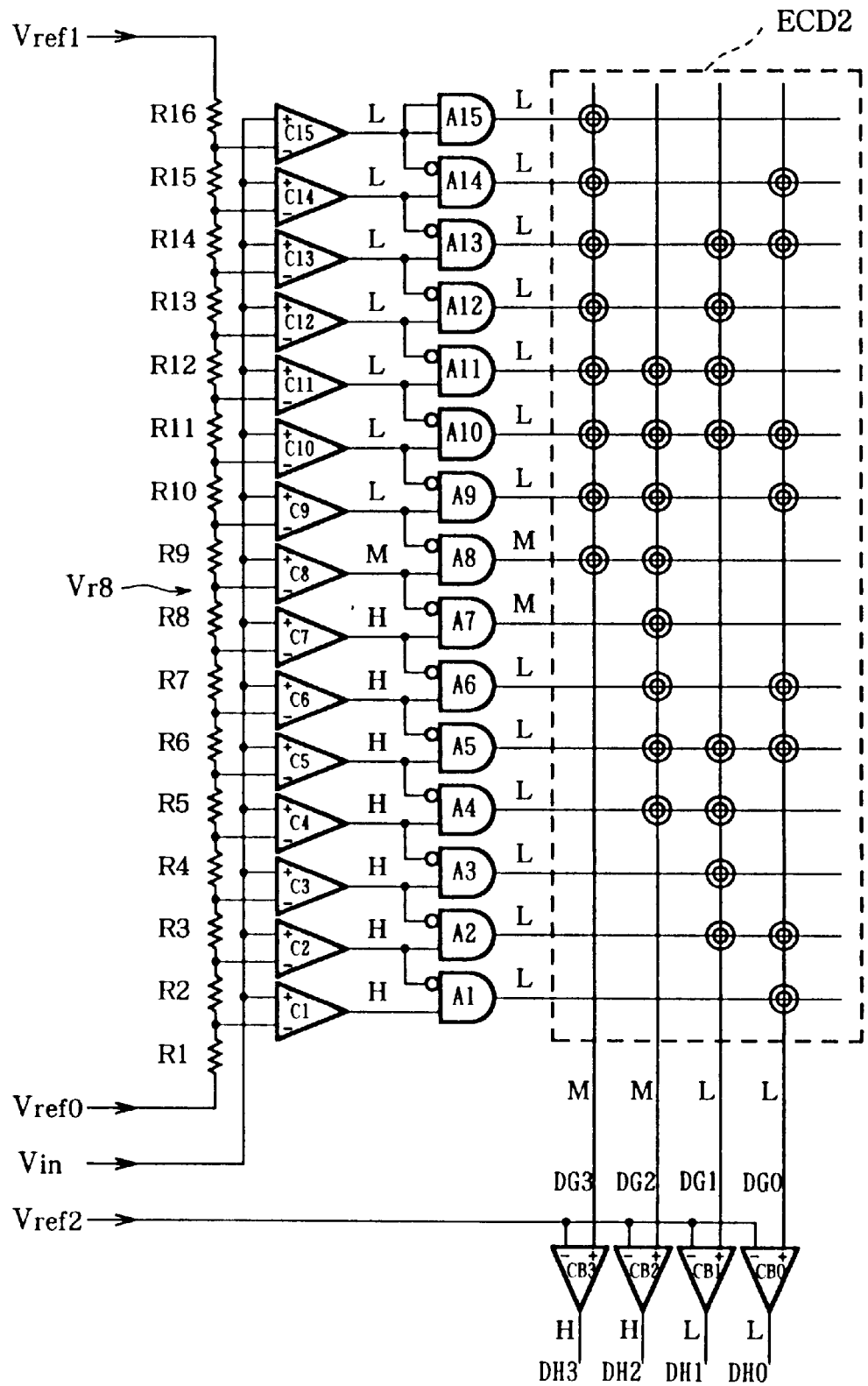
FIG. 15 is a circuit diagram of a third embodiment of the analog to digital converter according to the present invention.

FIG. 15 is a circuit diagram of a third embodiment of the analog to digital converter according to the present invention. In the present embodiment, comparators CB3 to CB0 are provided, and the output signals DG3, DG2, DG1, and DG0 of the encoder ECD2 and the reference voltage $V_{ref2}$ are compared. Here, the reference voltage $V_{ref2}$ is set to a lower level than the M level in the output signal of the encoder ECD2.

In the present embodiment, parts comprising the comparators C15 to C1 and the AND gates A15 to A1 are similar to those of the analog to digital converter of the related art shown in FIG. 1. These circuit components are described in FIG. 15 by using the same references as those of FIG. 1.

In the above configuration, for example, when the level of the input analog signal $V_{in}$ is substantially the same as the level of the reference voltage $V_{r8}$ input to the inverted input terminal of the comparator C8, the signal of the M level is output to the output terminal of the comparator C8. Both of the output signals of the AND gates A8 and A7 are held at the M level in accordance with this, and the output signals of the AND gates other than them are held at the L level.

The M level of the output signals of the AND gates A8 and A7 is transferred to the output side thereof by the encoder ECD2, and both of the outputs DG3 and DG2 of the encoder ECD2 are held at the M level. Namely, the output signal of the encoder ECD2 becomes "MMLL".

The output signal of the encoder ECD2 is compared with the reference voltage $V_{ref2}$ by the comparators CB3 to CB0. The reference voltage $V_{ref2}$ is set to a level lower than the M level in the output signal of the encoder ECD2, therefore the output signals of the comparators CB3, CB2, CB1, and CB0 become "HHLL" of the gray codes. According to FIG. 13, this corresponds to "HLLL" of the binary codes, and a correct conversion result has been obtained. Then, by the converter shown in FIG. 14, four bits DH3, DH2, DH1, and DH0 of gray codes output from the comparators CB3, CB2, CB1, and CB0 can be easily converted to the binary codes D3, D2, D1, and D0. In the case of the present embodiment, the comparator is provided on the output side of the encoder ECD2, therefore the number of comparators to be added is small compared with the first and second embodiments, therefore there is an advantage that the increase of the layout area of the circuit and the increase of the power consumption according to this can be suppressed to the lowest limit.

As explained above, according to the present embodiment, by comparing the output signals DG3, DG2, DG1, and DG0 of the encoder ECD2 with the reference voltage $V_{ref2}$ by the comparators CB3, CB2, CB1, and CB0 and setting the reference voltage $V_{ref2}$ to a level lower than the M level in the output signal of the encoder ECD, the M level in the output signal of the encoder ECD2 is compulsorily converted to the H level and the gray codes are generated, therefore there are advantages that a malfunction of the analog to digital converter can be prevented and the number of the comparators to be added is small, so the increase of the layout of the circuit can be suppressed to the lowest limit.

As explained above, according to the analog to digital converter of the present invention, a malfunction can be avoided and a high speed analog to digital conversion can be realized without a great change of the circuit configuration.

While the invention has been described by reference to specific embodiments chosen for purposes of illustration, it should be apparent that numerous modifications could be made thereto by those skilled in the art without departing from the basic concept and scope of the invention.

What is claimed is:

1. An analog to digital converter comprising:
   a first comparison circuit including a plurality of first comparators for comparing levels of reference voltages obtained from a plurality of voltage division resistor elements connected in series and an input analog signal to be converted into a digital code, said first comparators outputting signals of a first level or a second level in response to a result of the comparison, and outputting signals of a meta-level intermediate the first and second levels when a difference between said analog signal and the reference voltage is a predetermined value or less;
   a second comparison circuit comprising a plurality of second comparators for comparing output signals of said first comparators constituting the first comparators constituting the first comparison circuit with a reference voltage set to said intermediate meta-level or less and outputting the signal of either of said first or second levels according to the result of the comparison; and
   an encoder for converting the output signal of said second comparison circuit to a digital code.

2. An analog to digital converter according to claim 1, wherein said encoder outputs a gray code in response to the output signal of said second comparison circuit.

3. An analog to digital converter according to claim 2, further comprising a converter for converting the gray code from said encoder to a binary code.

4. An analog to digital converter comprising
   a first comparison circuit including a plurality of comparing means for comparing levels of reference voltages obtained from a plurality of voltage division resistor elements connected in series and an input analog signal, outputting signals of a first level or a second level in response to the result of the comparison, and outputting signals of an intermediate level of said first and second levels by the comparing means when a difference between said analog signal and the reference voltage is a predetermined value or less;
   an encoder for converting the output signal of said first comparison circuit to digital codes, said encoder having a signal converter for setting only one among a plurality of output signals to said first level according to the input signal from said first comparison circuit, holding other output signals at said second level, and holding at least one output signal at said intermediate level when receiving the signal of said intermediate level from said first comparison circuit;
   a second comparison circuit for comparing the output signal of said signal converter with the reference voltage set to said intermediate level or less and outputting the signal of either of said first and second levels in response to the result of the comparison; and
   a code converter for converting the output signal of said second comparison circuit to a gray code.

5. An analog to digital converter according to claim 4, further comprising a converting means for converting the gray code from said encoder to a binary code.

6. An analog to digital converter comprising
   a first comparison circuit including a plurality of comparing means for comparing levels of reference voltages obtained from a plurality of voltage division resistor elements connected in series and an input analog signal, outputting signals of a first level or a second level in response to the result of the comparison, and outputting signals of an intermediate level of said first and second levels by the comparing means when a difference between said analog signal and the reference voltage is a predetermined value or less;

an encoder for converting the output signal of said first comparison circuit to gray codes and outputting the converted codes containing the intermediate level when receiving the signal of said intermediate level from said first comparison circuit; and a third comparison circuit which is connected to each output signal line of said encoder, compares the output code of the encoder with the reference voltage set to said intermediate level or less, and outputs the signal of either of said first and second levels in response to the result of the comparison.

7. An analog to digital converter according to claim 6, further comprising a converting means for converting the output code of said second comparison circuit to a binary code.

* * * * *